US012732179B2

(12) United States Patent
Jana

(10) Patent No.: US 12,732,179 B2
(45) Date of Patent: Sep. 8, 2026

(54) GENERATING COMPLEX PWM SEQUENCES FOR POWER CONTROL APPLICATIONS

(71) Applicant: Cypress Semiconductor Corporation, San Jose, CA (US)

(72) Inventor: Dipanjan Jana, Bangalore (IN)

(73) Assignee: Infineon Technologies Americas Corp., El Segundo, CA (US)

( * ) Notice: Subject to any disclaimer, the term of this patent is extended or adjusted under 35 U.S.C. 154(b) by 31 days.

(21) Appl. No.: 19/025,796

(22) Filed: Jan. 16, 2025

(65) Prior Publication Data

US 2026/0012166 A1 Jan. 8, 2026

Related U.S. Application Data

(60) Provisional application No. 63/667,042, filed on Jul. 2, 2024.

(51) Int. Cl.

| | |
|---|---|
| ***H03K 7/08*** | (2006.01) |
| ***H02J 7/02*** | (2016.01) |
| ***H02M 1/088*** | (2006.01) |
| ***H02M 3/335*** | (2006.01) |

(52) U.S. Cl.

CPC .................. *H03K 7/08* (2013.01); *H02J 7/02* (2013.01); *H02M 1/088* (2013.01); *H02M 3/33573* (2021.05); *H02M 3/33592* (2013.01)

(58) Field of Classification Search

CPC ............ H03K 7/08; H02J 7/02; H02M 1/088; H02M 3/33573; H02M 3/33592; H02M 1/007; H02M 1/4225; H02M 3/33584

USPC .......................................................... 332/109

See application file for complete search history.

(56) References Cited

FOREIGN PATENT DOCUMENTS

JP 2020150601 * 9/2020

* cited by examiner

*Primary Examiner* — Richard Tan

(57) ABSTRACT

A system and method of generating complex pulse width modulation (PWM) sequences for power control applications. The method includes generating, by a first timer based on a main timer signal, a drive (QA) signal and an event signal indicative of a timing of the QA signal. The method includes providing the event signal to a second timer to cause the second timer to store the event signal to generate a stored event signal. The method includes maintaining, during a first group of cycles of the QA signal, a fixed phase difference between the QA signal and a drive (QC) signal by generating, by the second timer, the QC signal based on the main timer signal and the event signal. The method includes applying a current to a load based on the fixed phase difference between the QA signal and the QC signal.

20 Claims, 5 Drawing Sheets

100

GENERATING COMPLEX PWM SEQUENCES FOR POWER CONTROL APPLICATIONS

CROSS REFERENCE TO RELATED APPLICATION(S)

This application claims the benefit of and priority to U.S. Provisional Application Ser. No. 63/667,042, entitled "Generating Complex PWM Sequences for Power Control Applications" and filed on Jul. 2, 2024, which is expressly incorporated by reference herein in its entirety.

TECHNICAL FIELD

The present disclosure relates generally to the field of electronics, and more particularly, to systems and methods of generating complex pulse width modulation (PWM) sequences for power control applications.

BACKGROUND

A microcontroller is a compact integrated circuit designed to govern a specific operation in an embedded system. It typically includes a processor, memory, and input/output peripherals on a single chip, making it ideal for controlling devices like home appliances, automotive systems, and industrial machines. Pulse Width Modulation (PWM) waveforms are a crucial feature of many microcontrollers, allowing them to control the power delivered to various components. By adjusting the duty cycle of the PWM signal, the microcontroller can efficiently manage the speed of motors, the charging of batteries, and other analog functions. This technique is highly efficient because it minimizes power loss and heat generation, making it a popular choice in digital control systems. Overall, the combination of microcontrollers and PWM waveforms enables precise and efficient control in a wide range of applications.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
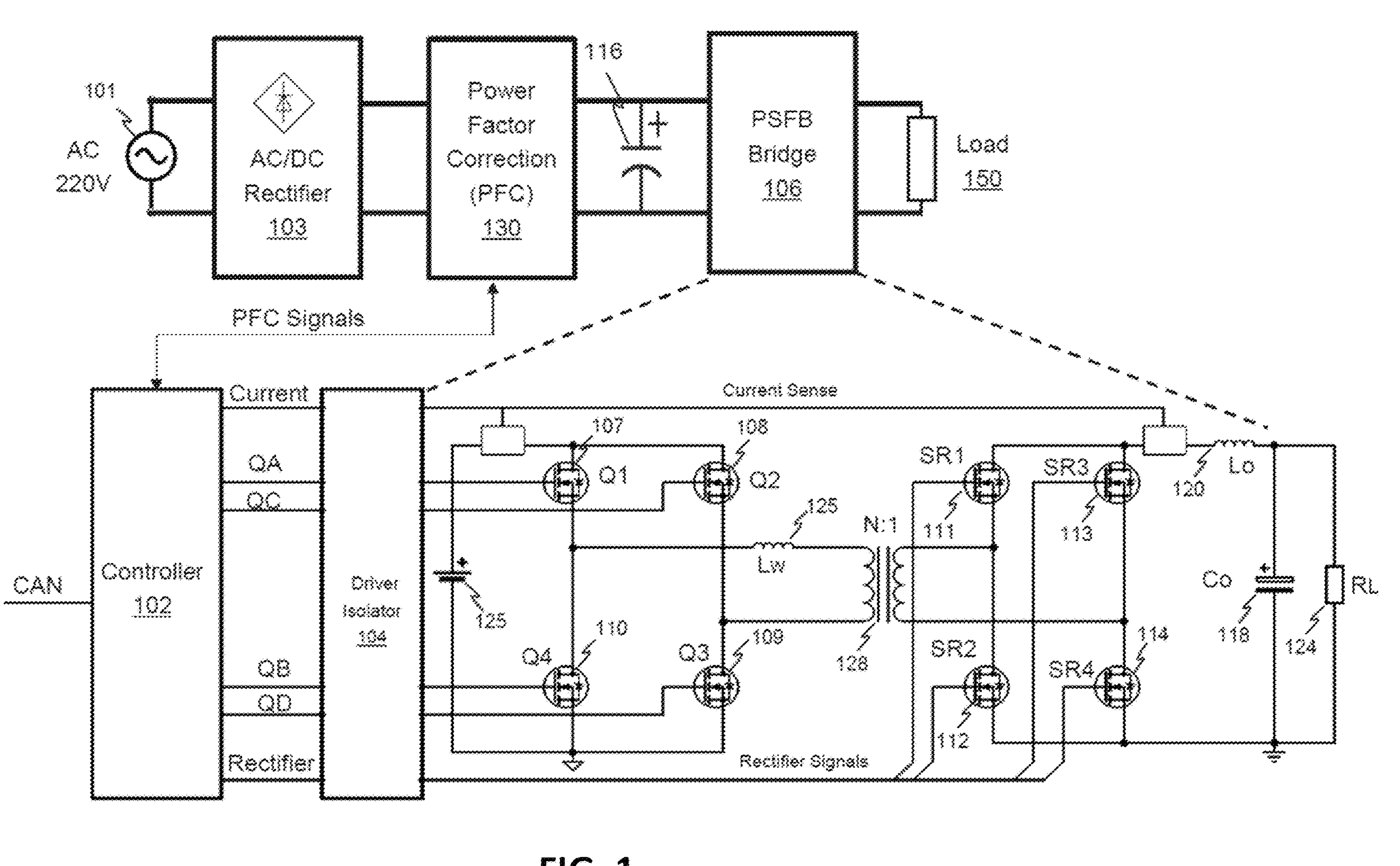
FIG. 1 illustrates a block diagram of an example Phase Shifted Full Bridge—On-Board Charger (PSFB-OBC) system, according to some embodiments.

The following description sets forth numerous specific details such as examples of specific systems, components, methods, and so forth, in order to provide a good understanding of various embodiments of the techniques described herein for generating complex pulse width modulation (PWM) sequences for power control applications. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

Phase-shifted full bridge (PSFB) drivers require two complementary PWM channels working in sync to generate a precise phase difference. Low-cost microcontrollers often struggle with this task for several reasons. First, their standard PWM channels lack multi-channel synchronization features which makes it impossible to synchronize the start of the timers using only software. Second, it is difficult to modify the PWM period of control signals at the phase change transition. Third, the PWM sequence must be maintained even during phase change transition between control signals, but conventional timers cannot be stopped. Fourth, even if timers are stopped and restarted quickly with a new period, generation of Dead Time is not trivial. Fifth, stopping and restarting of timers every PWM cycle requires per-PWM cycle interrupts and extremely high central processing unit (CPU) frequency for updating parameters. Sixth, an alternative approach of using interrupts is unreliable because it can result in unpredictable delays. The conventional system's inability to maintain the necessary precision leads to inefficiencies and potential issues in the power conversion process.

Aspects of the disclosure address the above-noted and other deficiencies by generating complex pulse width modulation (PWM) sequences for power control applications based on one or more multiplexers (e.g., one or more trigger multiplexers) and a plurality of timers. The present embodiments use combinations of standard PWM channels and another peripheral called a "trigger multiplexer" to synchronize PWM channels and to perform automatic phase and duty cycles updates. This solution may be fully implemented in hardware and not dependent on interrupts. By using a combination of two classes of peripherals (e.g., timers and trigger muxes), the present embodiments generate cycle-accurate complex signals.

The present embodiments can have several applications including but not limited to active rectifiers, asymmetric converters, motor control, various custom H-bridge topologies, multiphase converters, inverters, state machines for timing sequence, continuously variable signals, and current control logics.

In an illustrative embodiment, a microcontroller includes a first timer, a second timer, and a main timer. The main timer is configured to provide a main timer signal to the first timer. The first timer is configured to generate, based on the main timer signal, a drive (QA) signal and an event signal indicative of a timing of the QA signal. The first timer is configured to provide the event signal to the second timer. The second timer is configured to maintain, during a first group of cycles of the QA signal, a fixed phase difference between the QA signal and a drive (QC) signal by generating the QC signal based on the main timer signal and the event signal. The microcontroller includes a PWM generator to apply a current to a load based on the fixed phase difference between the QA signal and the QC signal. For example, the PWM generator may charge a battery according to a particular charging rate based on the fixed phase difference between the QA signal and the QC signal.

In another illustrative embodiment, a microcontroller includes an arrangement of multiple identical timers. A main timer (sometimes referred to as Timer-1) generates a signal for a second timer (sometimes referred to as Timer-2), a third timer (sometimes referred to as Timer-2), a fourth timer (sometimes referred to as Timer-4), and a fifth timer (sometimes referred to as Timer-5). A sixth timer (sometimes referred to as Timer-6) generates drive signals QA and QB based on a signal from the second timer. A seventh timer (sometimes referred to as Timer-7) generates drive signals QC and QD based on signals from the second timer and the fourth timer.

One of the purposes of the disclosed trigger mux is to carry signals from one timer to another timer. Creation or acting on any signal event is programmed in timer configurations, which can be changed in real time. In normal operation, the sixth timer and the seventh timer can continually generate a fixed phase difference and deliver a fixed power to charge a battery. When a change of power level is required, a processor can set the timer configuration in a phase adjustor (which includes a plurality of timers), which receives its input from one or more Analog-to-Digital Converter (ADCs) and expected control topology (e.g., Proportional Integral Derivative (PID)) in real time. These values are kept inside timer configuration buffers until each individual timer acts on it in its own time hence maintaining output in expected sequence. Drive signals QA, QB, QC, and QD (sometimes referred to herein as output signals QA, QB, QC, and QD) may be used to drive power devices which control different steps in charging of an EV battery.

FIG. 1 illustrates a block diagram of an example Phase Shifted Full Bridge—On-Board Charger (PSFB-OBC) system, according to some embodiments. The PSFB-OBC system 100 includes a signal source 101 that is electrically coupled to a rectifier circuit 103. The rectifier circuit 103 is electrically coupled to a power factor correction circuit 130. The power factor correction circuit 130 is electrically coupled to a high voltage storage capacitor 116. The high voltage storage capacitor 116 is electrically coupled to a PSFB 106. The PSFB 106 is electrically coupled to a load 150. In some embodiments, the load 150 may be a battery for an electric vehicle.

The PSFB 106 includes transistor 107 (Q1), transistor 108 (Q2), transistor 109 (Q3), transistor 110 (Q4), transistor 111 (SR1), and transistor 112 (SR2), transistor 113 (SR3), and transistor 114 (SR4). The transistors 107-114 may be based on any conventional transistor technology including, for example, Silicon Carbide Metal-Oxide-Semiconductor Field-Effect Transistors (SiC MOSFETs). The PSFB 106 includes inductor 125 (Lw) and inductor 120 (Lo). The PSFB 106 includes power source 127, capacitor 118, and transformer 128. The specific implementation depends on the design objectives and may include various additional sub-circuits.

The PSFB-OBC system 100 includes a controller 102 (e.g., microcontroller) that is electrically coupled to the AC/DC power factor correction 130 and a drive isolator 104. The drive isolator 104 is electrically coupled to the PSFB 106.

The controller 102 receives signals from an interface, such as a Controller Area Network (CAN) bus. The controller 102 and the AC/DC power factor correction 130 send and receive power factor correction (PFC) signals to each other. The controller 102 sends drive signals (QA-QD) to the PSFB 106. Specifically, the controller 102 sends a QA signal to transistor 107 (Q1), a QC signal to transistor 108 (Q2), a QB signal to transistor 110 (Q4), and a QD signal to transistor 109 (Q3). The controller 102 also sends a rectifier signal to transistors 111 (SR1), transistor 112 (SR2), transistor 113 (SR3), and transistor 114 (SR4).

Thus, the PSFB-OBC system 100 integrates two advanced technologies to enhance electric vehicle (EV) charging. The PSFB 106 is a highly efficient DC-DC converter that uses phase-shifted control to achieve zero-voltage switching, minimizing switching losses and improving overall efficiency. The On-Board Charger (OBC) is used to convert AC power into DC power, which can then be used to charge the EV's battery. By combining these technologies, the PSFB-OBC system ensures efficient and safe power conversion. This integration not only optimizes the charging process but also contributes to the sustainability and performance of electric vehicles.

Figure 2:
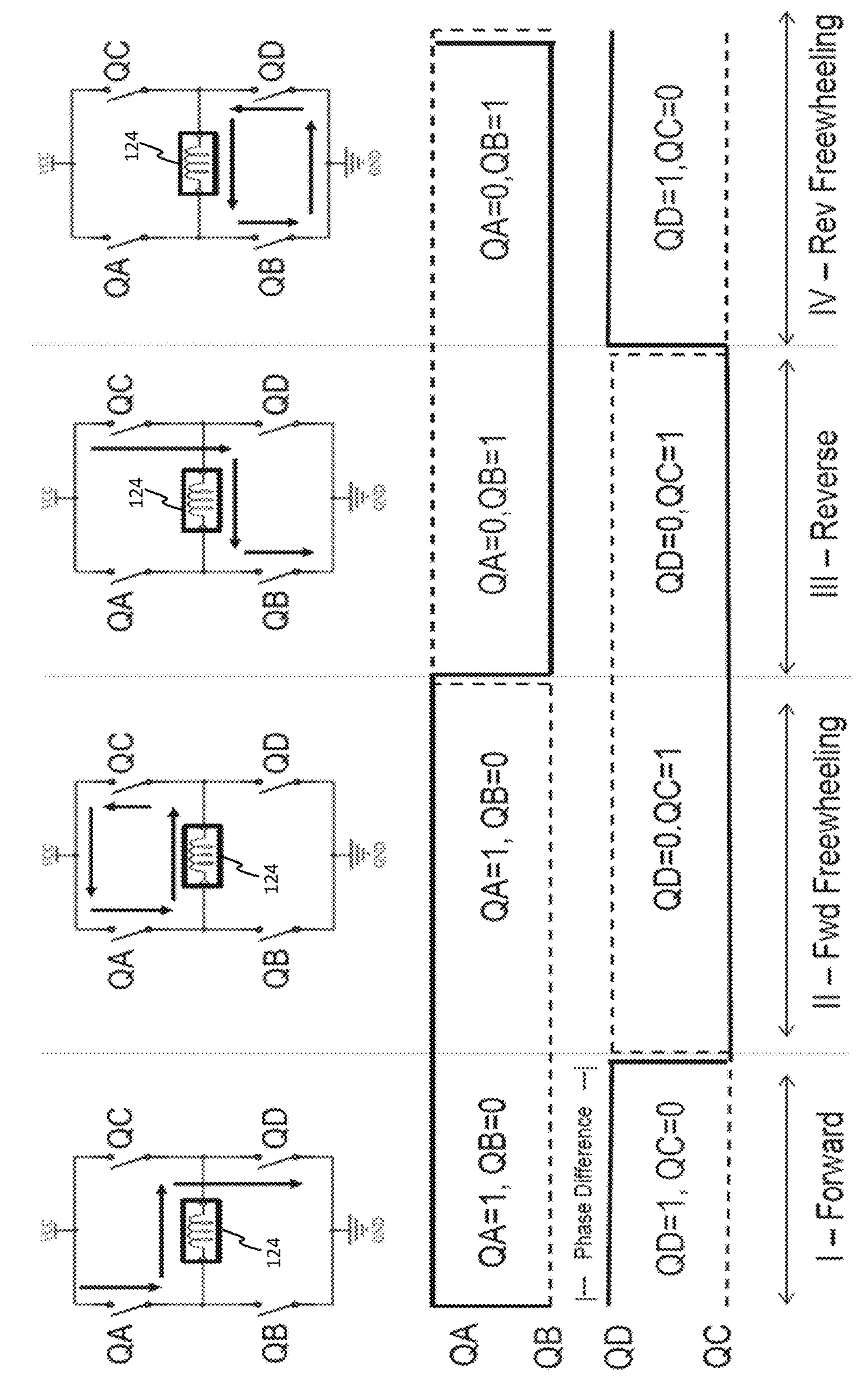
FIG. 2 illustrates a signal diagram of the drive signals (QA-QD) from the controller in FIG. 1 to produce the four stages of a single cycle, according to some embodiments.

FIG. 2 illustrates a signal diagram of the drive signals from the controller in FIG. 1 to produce (e.g., generate) the four stages of a single cycle, according to some embodiments. Specifically, signal diagram 200 shows the QA signal, the QB signal, the QC signal, and the QD signal. The QB signal is the compliment of the QA signal and the QD signal is the compliment of the QC signal.

The signal diagram 200 also shows the direction of the current through transistors QA-QD (transistors 107-110 in FIG. 1) for 4 different stages: (1) Forward Stage, (2) Forward Freewheeling Stage, (3) Reverse Stage, and (4) Reverse Freewheeling Stage. In some embodiments, this sequence may be maintained sequentially for proper operation. The signal diagram 200 shows that there is a phase difference between the rising edge of the QA signal and the rising edge of the QC signal. The controller 102 adjusts this phase difference to adjust the current that the PSFB 106 drives to the load 150. In some embodiments, this current may be referred to as the transformer primary current because it is produced at the transformer 128 and directed toward the load 150. Additional details about the controller's 102 techniques for adjusting the phase difference are described below with respect to FIG. 4.

Furthermore, in embodiments in which the load 150 is a battery, the controller 102 can adjust this phase difference to adjust the rate in which the PSFB 106 charges the battery. For example, the controller 102 can increase the phase difference to increase the rate in which the PSFB 106 charges the battery and decrease the phase difference to decrease the rate in which the PSFB 106 charges the battery.

Figure 3:
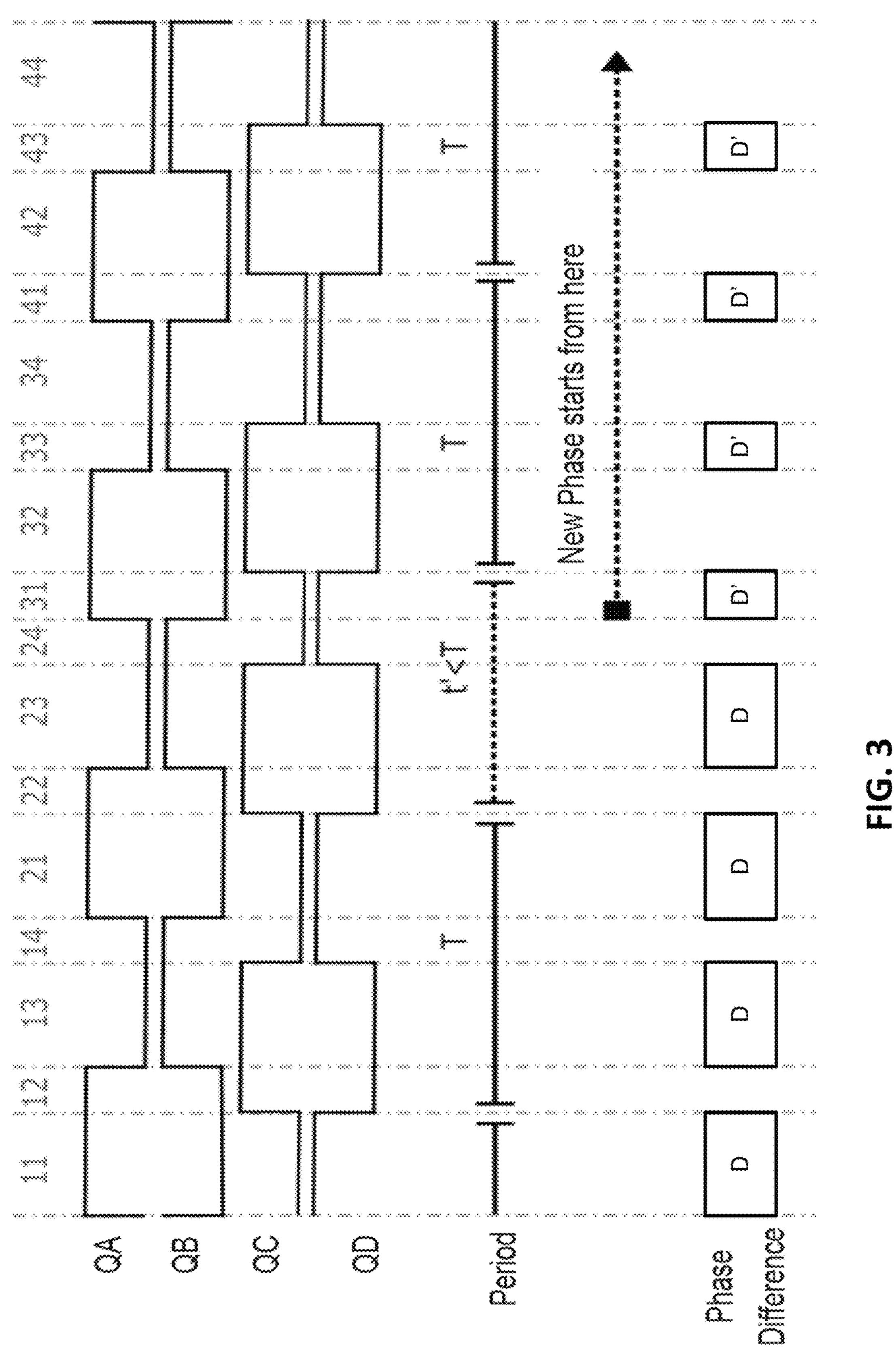
FIG. 3 illustrates a signal diagram of the drive signals (QA-QD), when the power output level changes, according to some embodiments.

FIG. 3 illustrates a signal diagram of the drive signals (QA-QD), when the power output level changes, according to some embodiments. Note that FIG. 3 is shown in a larger time scale than FIG. 2 to illustrate how the phase update may take place, according to some embodiments. The phase difference between signals QA and QD is indicated by D. The signal diagram 300 shows the repetitive four stages happening four times from 11-14, 21-24, 31-34, and 41-44. In each cycle, a first stage corresponds to a Forward Stage (i.e., 11, 21, 31, 41), a second stage correspond to a Forward Free-wheeling Stage (i.e., 12, 22, 32, 42), a third stage corresponds to a Reverse Stage (i.e., 13, 23, 33, 43), and a fourth stage corresponds to a Reverse Free-wheeling Stage (i.e., 14, 24, 34, 44).

A new phase is activated at timeslot 31, where the phase difference D changes to D'. The time period of drive signal QC is illustrated by period T. In the preparation to update the phase from 31, QC's period is changed for only one cycle (22-31), as indicated by t'<T.

The signal diagram 300 shows that the PSFB 106 is charging the battery during a particular time period within each of the four stages. A different current starts flowing when the phase difference takes place at timeslot 31.

Figure 4:
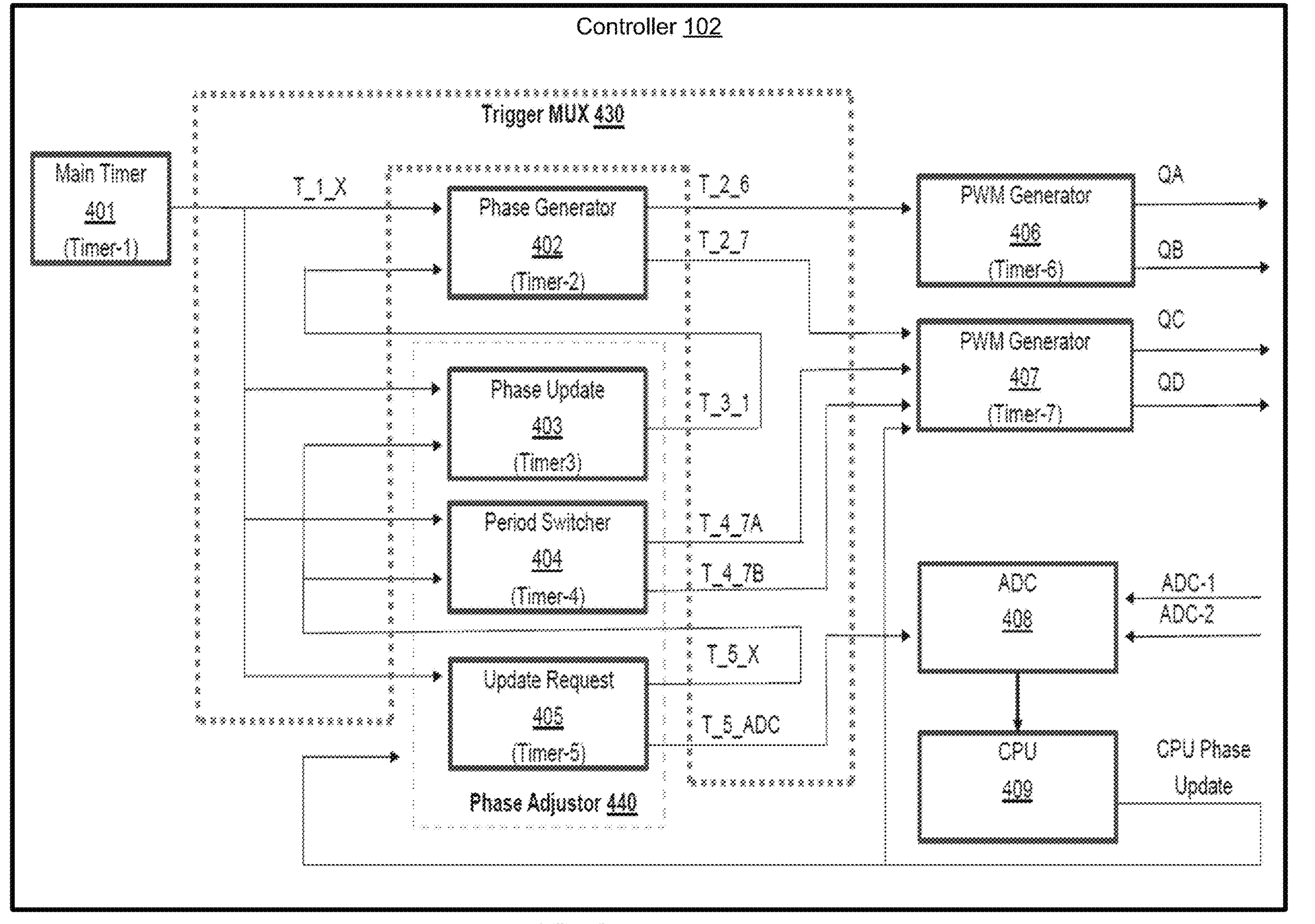
FIG. 4 illustrates a block diagram of the controller in FIG. 1, according to some embodiments.

FIG. 4 illustrates a block diagram of the controller in FIG. 1, according to some embodiments. The controller 102 includes an Analog-to-Digital Converter (ADC) 408 and a central processing unit (CPU) 409. As discussed herein, the controller 102 includes multiple timers. Specifically, the controller 102 includes a main timer 401 that is configured to generate a continuous signal (e.g., a main control signal). The controller 102 includes a phase generator 402, which is a timer that is configured to generate a phase difference between a first drive signal (e.g., QA signal, QB signal) and a second drive signal (e.g., QC signal, QD signal). The controller 102 includes a phase updater 403, which is a timer that is configured to function as a phase updater. The controller 102 includes a period switcher 404, which is a timer configured to function as a period switcher. The controller 102 includes an update request 405, which is a timer configured to function as an update request. The controller 102 includes a PWM generator 406, which is a timer configured to function as a PWM generator 406. The controller 102 includes a PWM generator 407, which is a timer configured to function as a PWM generator 407. In some embodiments, phase generator 402, phase updater 403, period switcher 404, update request 405, PWM generator 406, and PWM generator 407, may each be configured as a one shot circuit, such that they each generate a single output pulse of a specified duration in response to an input trigger signal.

Each of the timers shown in FIG. 4 are configured to receive multiple input signals and generate multiple output signals depending on its configuration. An input signal may indicate a start or stop event, a change of period, a change of duty cycle, and/or the like. An output signal may be a complementary PWM, a period match signal, a duty match signal, an interrupt signal, and/or the like. Each timer includes its own internal counter to allow the timer to keep track of time associated with an event. As shown in FIG. 4, each of the timers (e.g., timer-1, timer-2, . . . timer-7) are all symmetrical, except they are each configured to perform a different functionality. Below is additional description about the timers of FIG. 4.

The phase updater 403 loads the next duty cycle (this comes from CPU 409) for phase generator 402 to cause a phase update. The period switcher 404 loads a temporary Period & Revert (e.g., a calculated timing value 1 and a calculated timing value 2), which comes from update request 405, back after a specific delay.

Specifically, the controller 102 uses fast and frequent corrections. For example, one PWM cycle may be 3.8 microsecond. The controller 102 performs a correction every 10 PWM cycles, resulting in a normal sequence (e.g., Event 1 in FIG. 5) to happen 260,000 times/second and an update sequence (e.g., Event 6 in FIG. 5) to happen 26,000 times/second. These fast phase updates (called feedback control loop) are used to rectify errors arising from voltage fluctuations, voltage surge, noise, and/or temperature drift.

The CPU 409 calculates the error and load timer values. That is, once the update sequence is complete (e.g., Events 6 to 13 in FIG. 5), update request 405 sets an interrupt (e.g., Event 14 in FIG. 5) for the CPU 409 to prepare for the next update. Once the CPU 409 is free from other tasks, the CPU 409 attends to the interrupt, calculates the error, and calculates the timer values for future update (e.g., for timers 2, 3, 4, 7, etc. in FIG. 5) including the transition/temporary states (e.g., Events 9-13 in FIG. 5).

Next, the CPU 409 pre-loads the configuration in each timer's shadow register (e.g., timers 2, 3, 4, 7, etc.). This can happen any time after point 14 because of lengthy/complex math involved. Once loaded, the CPU 409 is again free to do some other tasks. This is one of the key advantages compared to hard interrupt-based techniques, where very fast a CPU is needed to complete the calculations within a very short time window (called cycle-by-cycle). However, the CPU 409 in controller 102 is allowed to address the interrupt at its own time starting point 14 and complete before the start of next update sequence (e.g., Event 6 in FIG. 5). Hence, a slow CPU 409 is enough to perform these operations.

Figure 5:
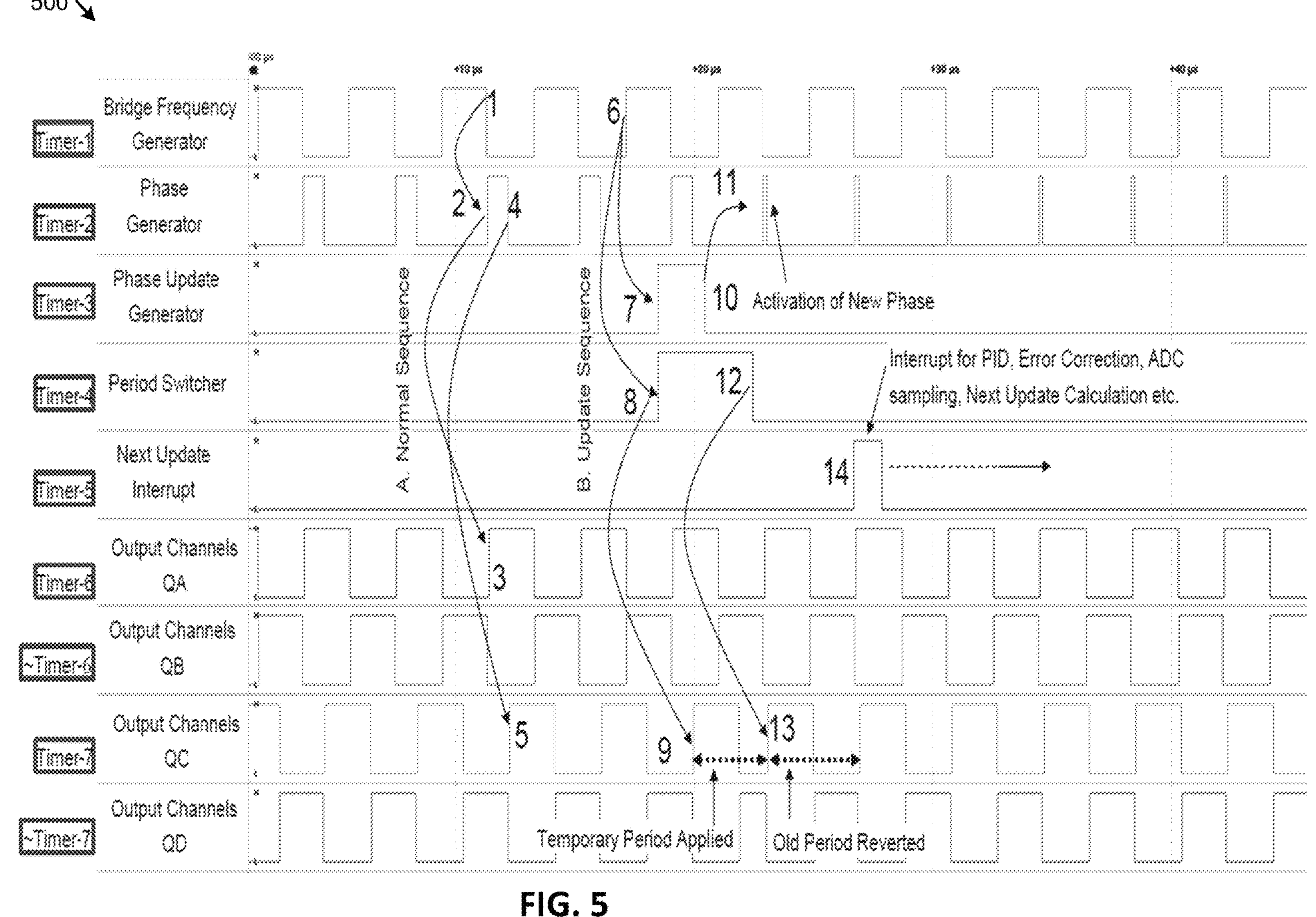
FIG. 5 illustrates a signal diagram of the output signals from each of the timers in FIG. 4 at different events, according to some embodiments.

When the next update sequence starts from Event 6 in FIG. 5, an automatic firing of events happens in the phase adjustor 440, which triggers shadow registers to come alive at the end of the event, resulting in a start of a new phase difference at point 13 in FIG. 5 (or slot 31 in FIG. 3).

The update request 405 initiates the next phase updating procedure by generating an interrupt/ADC trigger.

The controller 102 includes a PWM generator 406 that generates a positive drive signal and a negative/compliment drive signal with dead time, which are both used to control the transistors (e.g., transistors 107, 108, 109, 110, 111, 112) of the PSFB 106 in FIG. 1. The controller 102 includes a PWM generator 407 that generates a positive drive signal and a negative/compliment drive signal, which are also both used to control the transistors of the PSFB 106 in FIG. 1. The drive signals are PWM signals.

In some embodiments, the phase generator 402, the phase updater 403, the period switcher 404, the update request 405, the PWM generator 406, and/or the PWM generator 407 may each be further configured as a timer that is capable of generating a precise time delay or interval based on its input signal.

The controller includes a trigger multiplexer (mux) 430 to carry signals between each of the components shown in FIG. 4. The trigger mux 430 is a digital bus system configured to carry signals from one component (e.g., a timer, an ADC, a CPU) to another using a multiplex addressing system. The trigger mux 430 is also configured to route signals from one point to another point.

The controller 102 may support two operating modes: a normal sequence and an update sequence. In the normal sequence, the controller 102 operates the main timer 401, the phase generator 402, the PWM generator 406, and the PWM generator 407. In the update sequence, the controller 102 operates the phase updater 403, the period switcher 404, and the update request 405 to load new values into one or more of the timers.

Still referring to FIG. 4, the phase generator 402 receives a main timer signal (T_1_X) from the main timer 401. The phase generator 402 generates, based on the main timer signal (T_1_X), generate two signals (e.g., T_2_6,7). The phase generator 402 provides, via the trigger mux 430, the event signal to the PWM generators 407, 406 to cause the pulse width modulation. The PWM generators 406, 407 store values that cause the PWM output (e.g., QA-QC signals) with different delays.

During the normal sequence, the PWM generators 406, 407 generate the QA-QC signals based on the main timer signal and the event signal to maintain, during a first group of cycles, a fixed phase difference between the QA signal and the QC signal. The controller 102 charges a battery according to a particular charging rate based on the fixed phase difference between the QA signal and the QC signal.

During an update sequence, the controller 102 adjusts the phase difference between the QA-QC signals by loading values in the phase adjustor 440 and the PWM generator 407, which gets activated depending on chain of timing events in the phase update 403, the period switcher 404, the update request 405, and the PWM generator 407. After the update, a new phase difference is seen in the QA-QC signals. This new phase difference charges the battery in a different current than previous cycles.

In some embodiments, the PWM generator 407 and the phase adjustor 440 may receive the event signal while it is actively generating a cycle of the QC signal. For example, the PWM generator 407 might be in the middle of generating a cycle when it receives the event signal and may choose to defer activation to keep the sequence in order, as shown in FIG. 3.

The phase adjustor 440 generates, based on the main timer signal, signals T_5_ADC, T_4_7A, T_4_7B, T_3_1, and T_5_X. The generation of these multiple signals cause the phase update sequence to take place, as shown in timeslot 31 in FIG. 3. Signal T_5_X causes the phase updater 403 and period switcher 404 to start counting, resulting in the generation of signals T_4_7A, T_4_7B, and T_3_1 based on loaded values by CPU 408. In response to receiving signal T_3_1, the phase generator 402 generates signal T_2_7 which causes the generation of the QC signal. Furthermore, signal T_4_7A, B causes the period transition in the QC signal, as shown in timeslots 22 to 32 in FIG. 3.

The phase adjustor 440 generates, based on the main timer signal (T_1_X) and the second delay value, a third trigger signal (T_3_1) and a fourth trigger signal (T_4_7A). The phase adjustor 440 provides the third trigger signal to the phase generator 402 and the fourth trigger signal to the PWM generator 407.

The controller 102 maintains, during the next cycle of the second group of cycles of the QA signal, the different fixed phase difference between the QA signal and the QC signal by generating the QA signal from the phase generator 402 based on the main timer signal and the third trigger signal. The PWM generator 407 generates the QC signal based on the main timer signal, the fourth trigger signal, and/or the stored event signal.

FIG. 5 illustrates a signal diagram of the output signals from each of the timers in FIG. 4 at different events, according to some embodiments. Event 1, which occurs for every falling edge of the main timer 401, initiates the phase generator 402 to start. Event 2, which is the rising edge of phase generator 402, initiates the PWM generator 406 to start. Event 3 is the start signal of the PWM generator 406. Event 4, which is the falling edge of the phase generator 402, initiates the PWM generator 407 to start. Events 3, 5 correspond to the start of PWM generators 406, 407.

When a phase change is required, then an update sequence is activated. Event 6, which is the rising edge of the main timer 401 (e.g., this only happens when the period of the phase update 403 and/or period switcher is finished), starts the next updating process for the respective duty cycle and period values into the phase generator 402 and the PWM generator 407 by using the phase updater 403 and the period switcher 404 as intermediate signals.

Event 6, which is the rising edge of main timer 401, starts a counting process in the phase updater 403. Event 7 takes place after a delay. Event 7, which is the rising edge of the phase updater 403, starts a second delay resulting in event 10.

Event 6 also starts counting process in the phase switcher 404. Event 8 takes place after a delay. Event 8, which is the rising edge of phase switcher 404, starts a second delay resulting in event 12.

Event 10, which is the falling edge of the phase updater 403, causes event 11. Event 11 causes a new duty cycle to load in the phase generator 402. Event 8, which is a rising edge of the period switcher 404, causes event 9. Event 9 loads a new period in the PWM generator 407 and store a current value (swap).

Event 12, which is the falling edge of period switcher 404, causes event 13. Event 13, which is the rising edge of PWM generator 407, causes a swap back to the previously stored value from event 9.

Event 14 is when an interrupt is generated for CPU 409 to be used for ADC sampling and other control process, such as proportional integral derivative control (PID). The next update values are loaded into the timers (which will take effect in the next event 6).

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "generating," "providing,"

"maintaining," "charging," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may include firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
generating, by a first timer based on a main timer signal, a drive (QA) signal and an event signal indicative of a timing of the QA signal;
providing the event signal to a second timer to cause the second timer to store the event signal to generate a stored event signal;
maintaining, during a first group of cycles of the QA signal, a fixed phase difference between the QA signal and a drive (QC) signal by generating, by the second timer, the QC signal based on the main timer signal and the event signal; and
applying a current to a load based on the fixed phase difference between the QA signal and the QC signal.

2. The method of claim 1, wherein applying the current to the load further comprises charging a battery according to a particular charging rate, and further comprising:
adjusting, after the first group of cycles of the QA signal, a phase of the QC signal to produce a different fixed phase difference between the QA signal and the QC signal;
maintaining, during a second group of cycles of the QA signal after the first group of cycles of the QA signal, the different fixed phase difference between the QA signal and the QC signal; and
charging the battery according to a lower charging rate based on the different fixed phase difference.

3. The method of claim 1, wherein the second timer receives the event signal while the second timer is actively generating a cycle of the QC signal.

4. The method of claim 2, wherein the second group of cycles of the QA signal comprises a first cycle and a next cycle after the first cycle, and further comprising:
calculating, by a processing device, a first delay value dedicated to the first cycle of the second group of cycles and a second delay value dedicated to the next cycle of the second group of cycles; and
providing, by the processing device to a phase adjustor, a phase update signal comprising the first delay value and the second delay value.

5. The method of claim 4, further comprising:
generating, by the phase adjustor based on the main timer signal and the first delay value, a first trigger signal and a second trigger signal; and
providing the first trigger signal to the first timer and the second trigger signal to the second timer.

6. The method of claim 5, further comprising:
maintaining, during the first cycle of the second group of cycles of the QA signal, the different fixed phase difference between the QA signal and the QC signal by:
generating, by the first timer, the QA signal based on the main timer signal and the first trigger signal; and
generating, by the second timer, the QC signal based on the main timer signal, the second trigger signal, and the stored event signal.

7. The method of claim 4, further comprising:
generating, by the phase adjustor based on the main timer signal and the second delay value, a third trigger signal and a fourth trigger signal; and
providing the third trigger signal to the first timer and the fourth trigger signal to the second timer.

8. The method of claim 7, further comprising:
maintaining, during the next cycle of the second group of cycles of the QA signal, the different fixed phase difference between the QA signal and the QC signal by:
generating, by the first timer, the QA signal based on the main timer signal and the third trigger signal; and generating, by the second timer, the QC signal based on the main timer signal, the fourth trigger signal, and the stored event signal.

9. The method of claim 4, wherein the second delay value negates an impact the first delay value previously had on at least one of the QA signal or the QC signal.

10. The method of claim 1, wherein providing the event signal to the second timer is via one or more multiplexers.

11. A microcontroller, comprising:

a first timer;

a second timer; and a main timer coupled to the first timer and the second timer, wherein the main timer is configured to provide a main timer signal to the first timer, wherein the first timer is configured to:

generate, based on the main timer signal, a drive (QA) signal and an event signal indicative of a timing of the QA signal; and provide the event signal to the second timer;

wherein the second timer is configured to:

maintain, during a first group of cycles of the QA signal, a fixed phase difference between the QA signal and a drive (QC) signal by generating the QC signal based on the main timer signal and the event signal; and a PWM generator configured to apply a current to a load based on the fixed phase difference between the QA signal and the QC signal.

12. The microcontroller of claim 11, wherein to apply the current to the load, the PWM generator is further to charge a battery according to a particular charging rate, and further comprising:

a phase adjustor configured to adjust, after the first group of cycles of the QA signal, a phase of the QC signal configured to produce a different fixed phase difference between the QA signal and the QC signal; and wherein the second timer is further configured to:

maintain, during a second group of cycles of the QA signal after the first group of cycles of the QA signal, the different fixed phase difference between the QA signal and the QC signal; and wherein the PWM generator is further configured to:

charge the battery according to a lower charging rate based on the different fixed phase difference.

13. The microcontroller of claim 11, wherein the second timer is further configured to:

receive the event signal while the second timer is actively generating a cycle of the QC signal.

14. The microcontroller of claim 12, wherein the second group of cycles of the QA signal comprises a first cycle and a next cycle after the first cycle, and further comprising a processing device configured to:

calculate a first delay value dedicated to the first cycle of the second group of cycles and a second delay value dedicated to the next cycle of the second group of cycles; and provide, to the phase adjustor, a phase update signal comprising the first delay value and the second delay value.

15. The microcontroller of claim 14, wherein the phase adjustor is further configured to:

generate, based on the main timer signal and the first delay value, a first trigger signal and a second trigger signal; and provide the first trigger signal to the first timer and the second trigger signal to the second timer.

16. The microcontroller of claim 15, wherein the first timer is further configured to generate the QA signal based on the main timer signal and the first trigger signal; and the second timer is further configured to generate the QC signal based on the main timer signal, the second trigger signal, and the event signal.

17. The microcontroller of claim 14, wherein the phase adjustor is further configured to:

generate, based on the main timer signal and the second delay value, a third trigger signal and a fourth trigger signal; and provide the third trigger signal to the first timer and the fourth trigger signal to the second timer.

18. The microcontroller of claim 17, wherein the first timer is further configured to generate the QA signal based on the main timer signal and the third trigger signal; and the second timer is further configured to generate the QC signal based on the main timer signal, the fourth trigger signal, and the event signal.

19. The microcontroller of claim 11, wherein the first timer provides the event signal to the second timer via one or more multiplexers.

20. A pulse width modulation (PWM) system, comprising:

a plurality of timers comprising a counter; and one or more multiplexers coupled between the plurality of timers, wherein the plurality of timers is configured to:

generate a drive (QA) signal and an event signal indicative of a timing of the QA signal; and store the event signal in the counter;

maintain, during a first group of cycles of the QA signal, a fixed phase difference between the QA signal and a drive (QC) signal by generating the QC signal based on the event signal in the counter; and apply a current to a load based on the fixed phase difference between the QA signal and the QC signal.

* * * * *